(12) United States Patent
Macbeth et al.

(10) Patent No.: US 6,373,257 B1
(45) Date of Patent: Apr. 16, 2002

(54) ARC FAULT CIRCUIT INTERRUPTER

(75) Inventors: Bruce F. Macbeth; Thomas N. Packard, both of Syracuse, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 0 days.

(21) Appl. No.: 09/208,193

(22) Filed: Dec. 9, 1998

(51) Int. Cl.[7] .......................... G01R 31/08; G01R 31/14
(52) U.S. Cl. ....................... 324/536; 324/509
(58) Field of Search ................... 324/536, 508, 324/509, 424, 529, 530, 531; 361/42

(56) References Cited

U.S. PATENT DOCUMENTS

| 5,121,282 A | 6/1992 | White |
| 5,185,684 A | 2/1993 | Beihoff et al. |
| 5,185,685 A | 2/1993 | Tennies et al. |
| 5,185,686 A | 2/1993 | Hansen et al. |
| 5,185,687 A | 2/1993 | Beihoff et al. |
| 5,206,596 A | 4/1993 | Beihoff et al. |
| 5,208,542 A | 5/1993 | Tennies et al. |
| 5,223,795 A | 6/1993 | Blades |
| 5,224,006 A | 6/1993 | MacKenzie et al. |
| 5,307,230 A | 4/1994 | MacKenzie |
| 5,432,455 A | 7/1995 | Blades |
| 5,434,509 A | 7/1995 | Blades |
| 5,452,223 A | 9/1995 | Zuercher et al. |
| 5,453,723 A | 9/1995 | Fello et al. |
| 5,459,630 A | 10/1995 | MacKenzie et al. |
| 5,519,561 A | 5/1996 | Mrenna et al. |
| 5,590,012 A | 12/1996 | Dollar, II |
| 5,682,101 A | 10/1997 | Brooks et al. |
| 5,691,869 A | 11/1997 | Engel et al. |
| 5,706,154 A | 1/1998 | Seymour |
| 5,706,159 A | 1/1998 | Dollar, II et al. |
| 5,726,577 A * | 3/1998 | Engel et al. ................. 324/536 |
| 5,729,145 A | 3/1998 | Blades et al. |
| 5,805,397 A | 9/1998 | MacKenzie |
| 5,805,398 A | 9/1998 | Rae |
| 5,815,352 A | 9/1998 | Mackenzie |
| 5,818,671 A | 10/1998 | Seymour et al. |
| 5,825,598 A | 10/1998 | Dickens et al. |
| 5,835,321 A | 11/1998 | Elms et al. |
| 5,839,092 A | 11/1998 | Erger et al. |

* cited by examiner

*Primary Examiner*—Safet Metjahic
*Assistant Examiner*—J Kerveros
(74) *Attorney, Agent, or Firm*—Wall Marjama & Bilinski LLP

(57) ABSTRACT

An arc fault detector for detecting electric power lines includes a sensor for sensing the derivative of the current on the electric power line, a converter circuit for converting the derivative of the line current into first and second signals, the first signal responsive to positive step transitions of arc fault current, and the second signal responsive to negative step transitions of arc current, and a temporal detector for signaling the presence of an arc fault when one of the first and second signals follows the other within a predetermined time, or window, and in which a sequence of one of the signals following the other signal occurs in a second predetermined interval of time.

28 Claims, 9 Drawing Sheets

ARC FAULT CIRCUIT INTERRUPTER

BACKGROUND OF TH INVENTION

1. Field of the Invention

This invention relates generally to arc fault circuit interrupters, and more particularly to an arc fault circuit interrupter that reliably detects arc faults and rejects electrically similar phenomena, such as noise produced by lamp dimmers, motor controllers, and other random noise sources.

2. Description of the Prior Art

Arc detection is an enhancement to thermal magnetic overload detection, which alone may not detect and respond to arc faults. A number of devices for detecting arc faults and methods of detection have been used in the past. These include the use of E and B field arc sensors, detecting the amplitude of the rate of change of current signals when an arc fault occurs, the use of non-overlapping band pass filters to detect white noise characteristic of arcs, and detecting the disappearance of signals indicating the presence of arcs near zero current crossings. While some of these techniques are more or less effective, they require relatively sophisticated circuits. Heretofore, most arc detection circuits have been incorporated in circuit breakers.

The impedance of electrical circuits to the signals that indicate the presence of an arc fault may make it more difficult to detect arc faults at a circuit breaker than closer to the fault.

There is a need for simple economical arc fault detectors that can be included in wiring devices such as receptacles, plugs or in-line devices, and that offer the same downstream protection as an arc fault detector incorporated in a circuit breaker, but at lower cost. There is a need for an arc fault circuit detector in wiring devices that can be provided at a reduced cost compared with arc fault circuit detecting circuit breakers that is comparable to the reduction in cost between ground fault interrupting receptacles and ground fault interrupting circuit breakers.

Light dimmers are very commonly used in residences where the arc fault circuit interrupters of this invention are likely to be employed. Because light dimmers produce a characteristic noise signature that is similar to the signal produced by some arc faults, it is important for arc fault circuit interrupters to be able to distinguish the signals produced by actual arcs from the signals produced by light dimmers, to avoid false tripping.

SUMMARY OF THE INVENTION

It is an object of this invention to provide an arc fault circuit interrupter that employs an electrical circuit that is simple enough, inexpensive enough and small enough to be included in wiring devices. It is another object of this invention to provide an arc fault circuit interrupter that is sensitive to arc faults, but resistant to false tripping, due to noise created by lamp dimmers and the like.

It is another object of this invention to provide an arc fault circuit interrupter that is sensitive to relatively low amplitude series arc faults of at least 5 amps of arc current, typically in series with the load and commonly referred to as Type A arc faults.

It is another object of this invention to provide an arc fault circuit interrupter that detects parallel or line to line arcs, producing currents of 75 amps or more, commonly referred to as Type B arc faults.

Briefly stated, and in accordance with a presently preferred embodiment of the invention, an arc fault detector for detecting electric power lines includes a sensor for sensing the derivative of the current on the electric power line, a converter circuit for converting the derivative of the line current into first and second signals, the first signal responsive to positive step transitions of arc fault current, and the second signal responsive to negative step transitions of arc current, and a temporal detector for signaling the presence of an arc fault when one of the first and second signals follows the other within a predetermined time, or window, and in which a sequence of one of the signals following the other signal occurs in a second predetermined interval of time.

In accordance with a preferred embodiment of the invention, the sensor is a current transformer with the electric power line being protected as its primary, and having a center tapped secondary winding producing first and second signal voltages of opposite polarity with respect to the center tap, in which the voltages are proportional to the rate of change of current in the power line primary winding, so that a step of current in the primary winding in one direction produces a pulse of voltage of one polarity, with respect to the center tap at one end of the secondary followed by a step of current in the other direction, which produces a second pulse of voltage of the same polarity with respect to the center tap at the other end of the secondary.

In accordance with another aspect of the invention, the current transformer has a core conformed of powdered metal.

In accordance with another aspect of the invention, the circuit for converting the derivative of the line current into first and second signals is an inverter circuit.

In accordance with another aspect of the invention, the first window of time is less than one half the period of the power line AC current.

In accordance with a still further aspect of the invention, a discriminator circuit is included for ignoring a predetermined number of signal sequences to reject normal load current step events. Brief Description of the Drawings:

The novel aspects of the invention are set forth with particularity in the appended claims. The invention itself, together with further objects and advantages thereof may be more readily comprehended by reference to the following detailed description of a presently preferred embodiment of the invention taken in conjunction with the accompanying drawings, in which:

Figure 1:
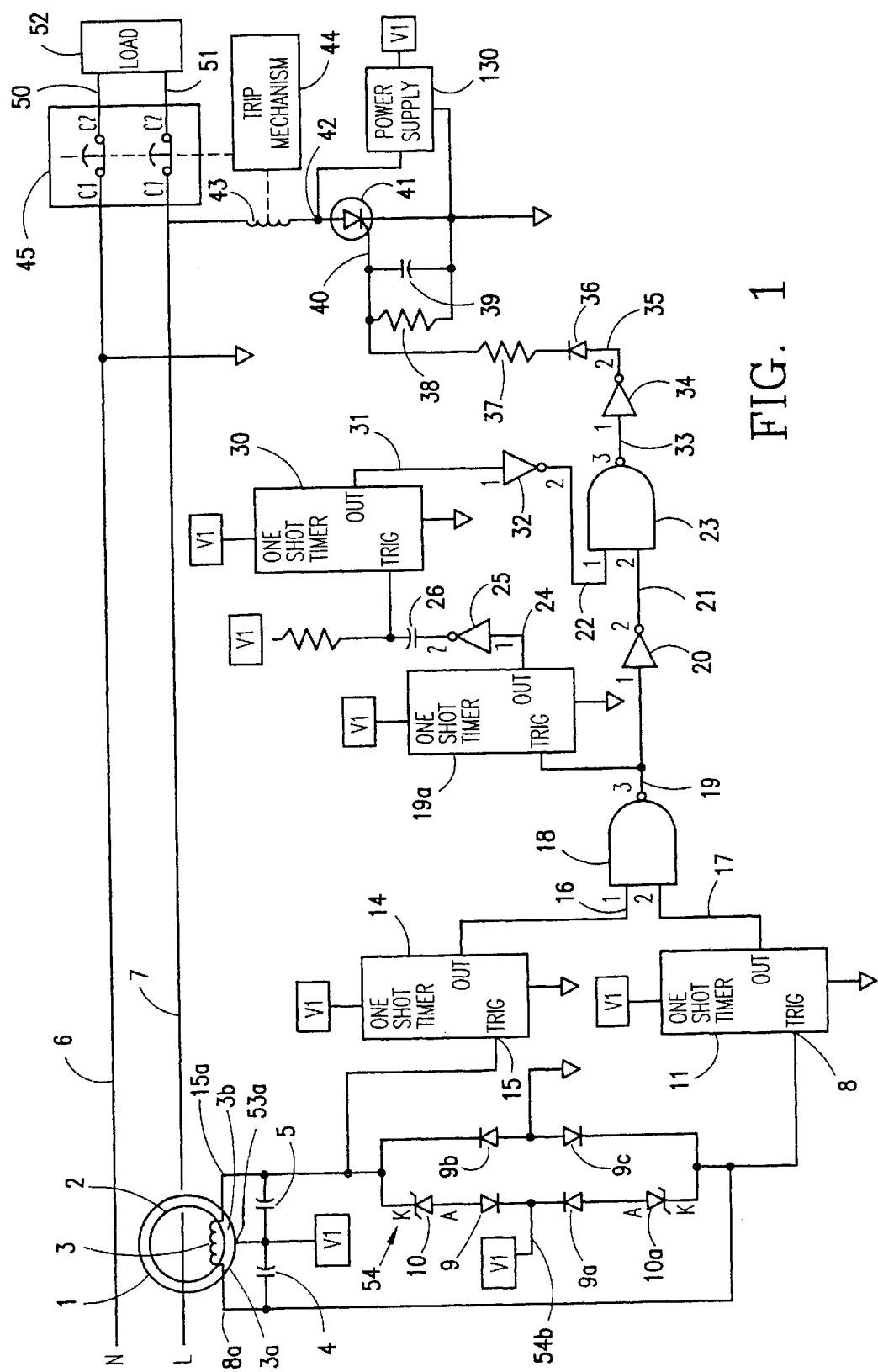
FIG. 1 is a schematic diagram of an arc fault circuit interrupter in accordance with the invention for detecting series and parallel arcs.
Figure 2:
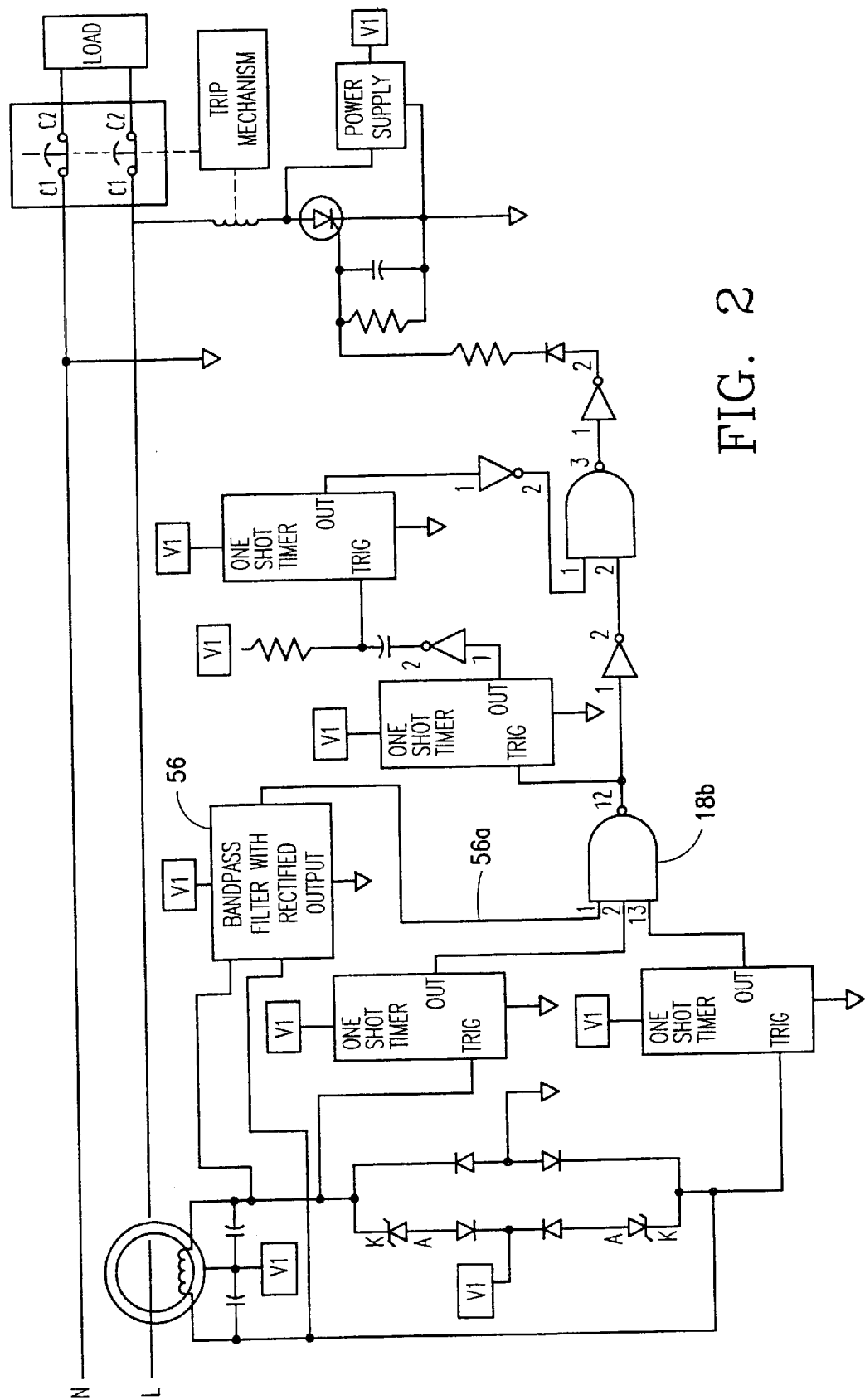
FIG. 2 is a circuit diagram of an arc fault circuit interrupter in accordance with the invention for detecting series and parallel arcs in the presence of arc noise.
Figure 3:
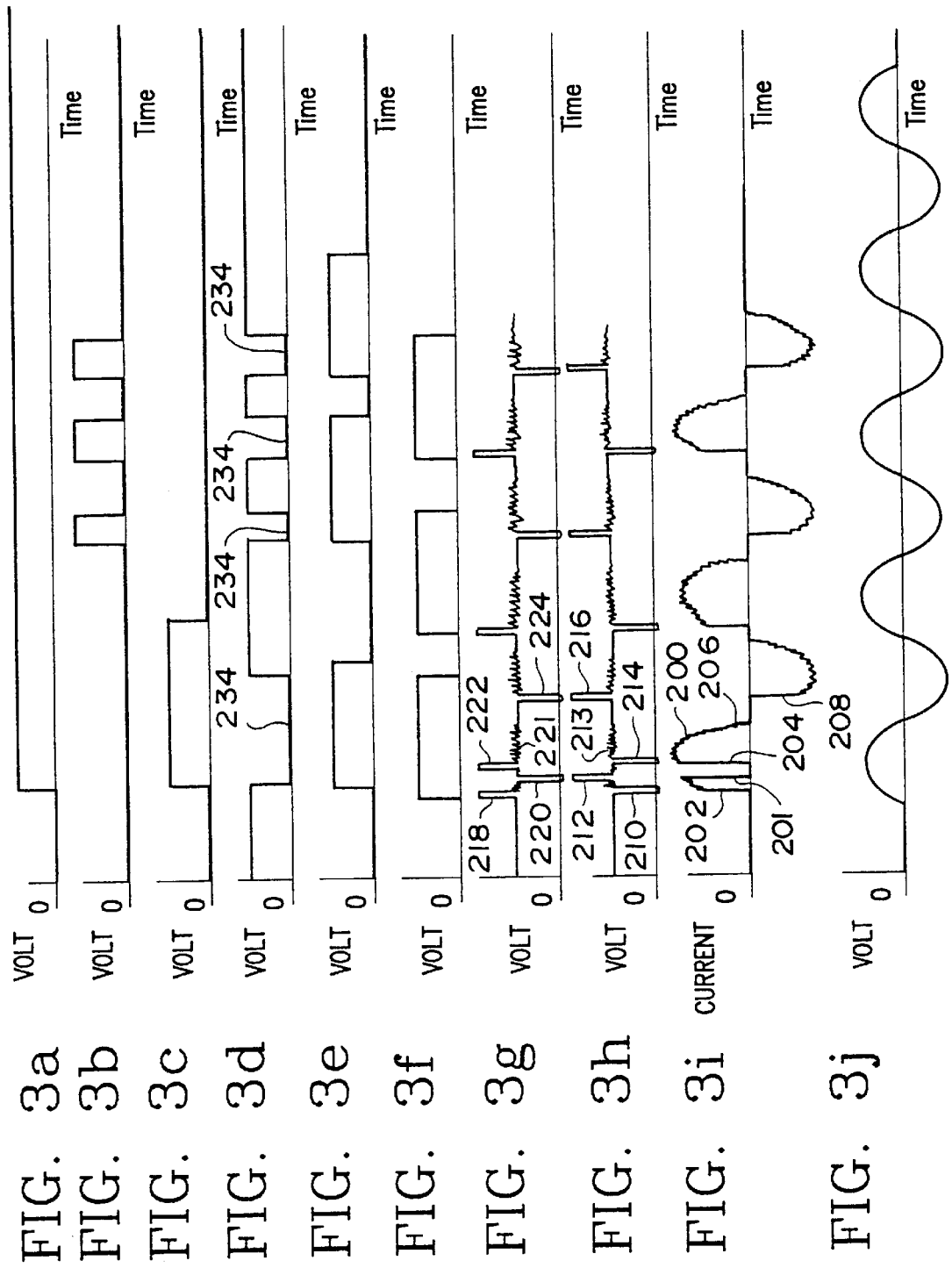
Figure 4:
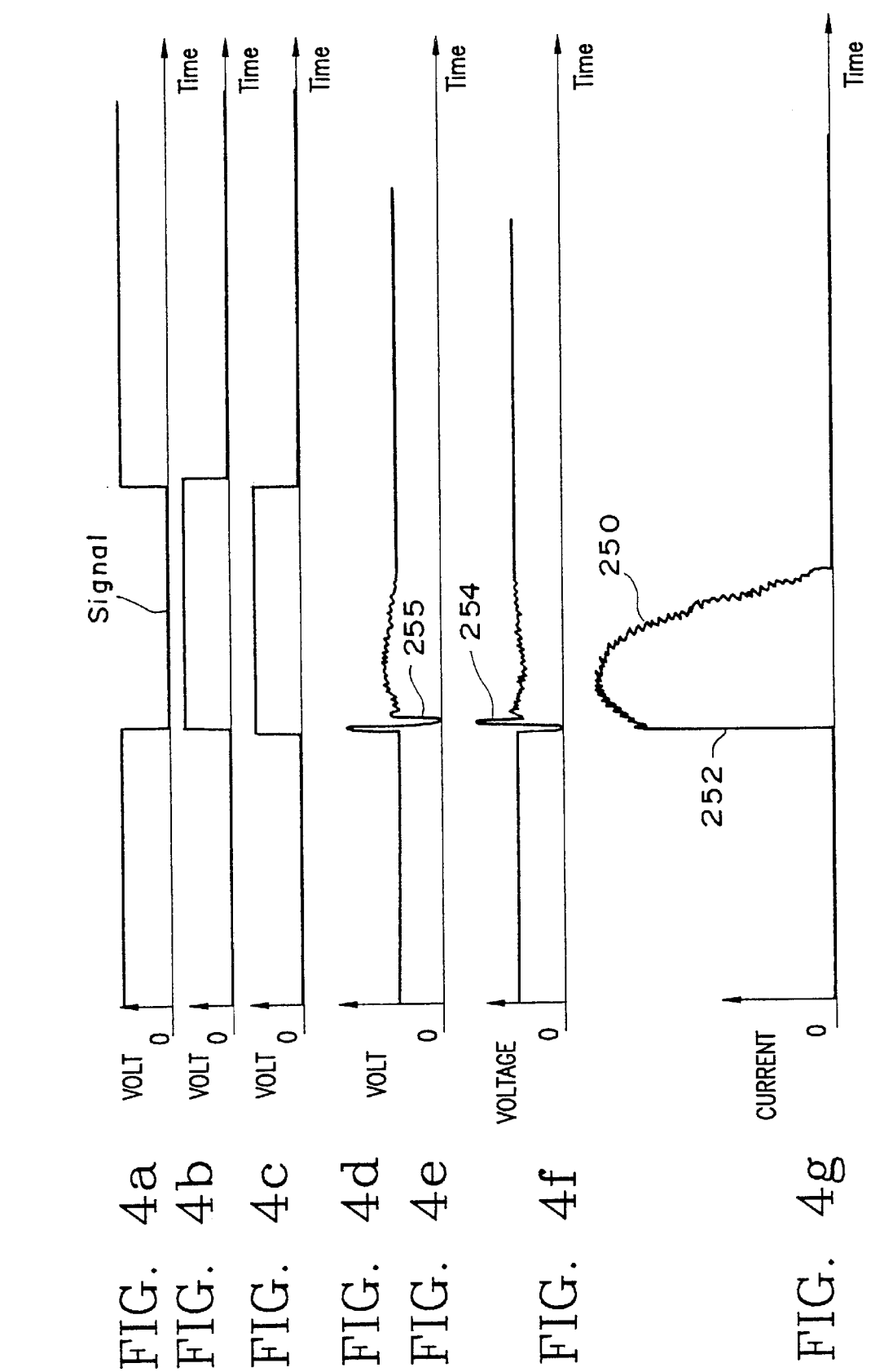
Figure 5:
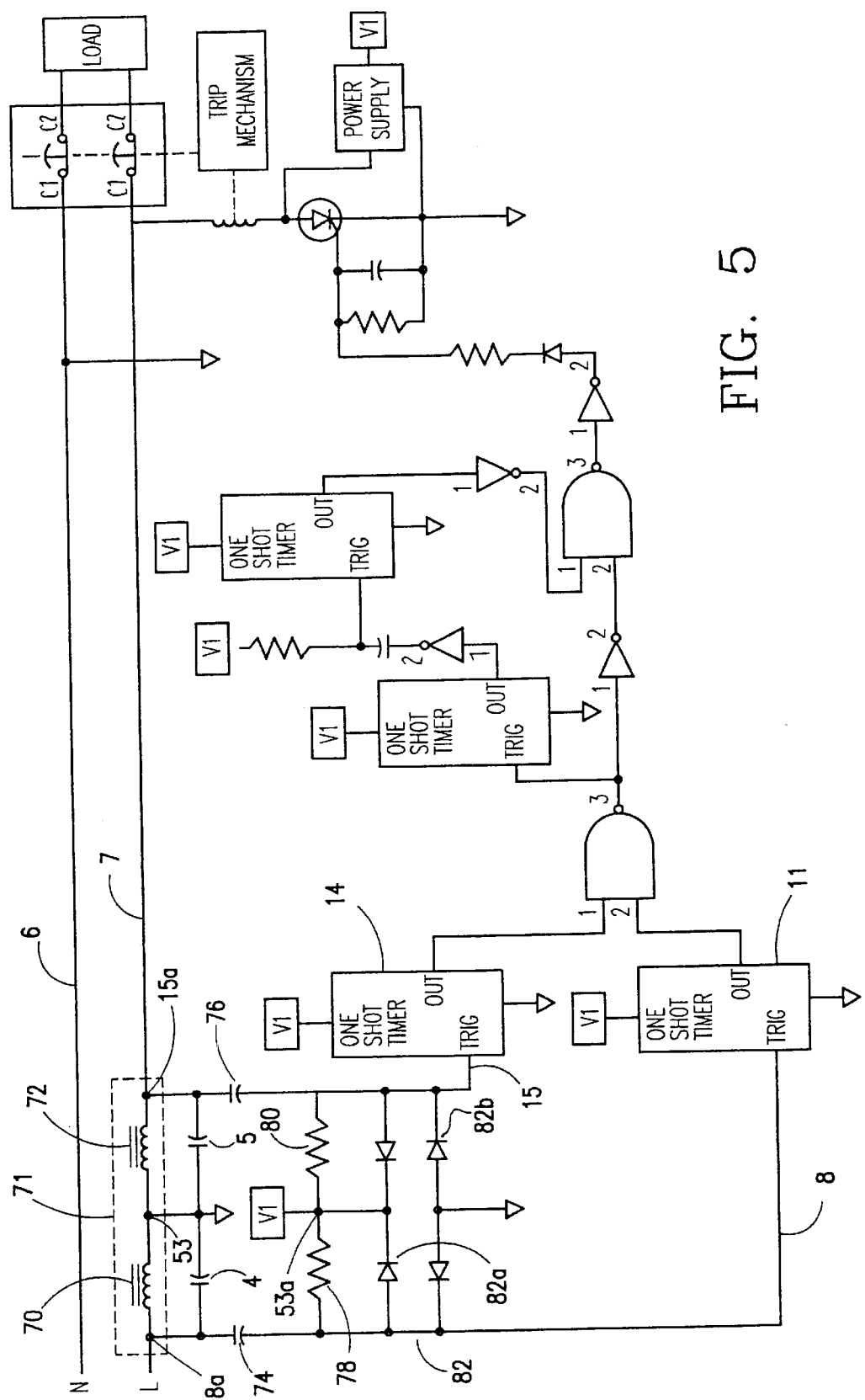
Figure 6A:
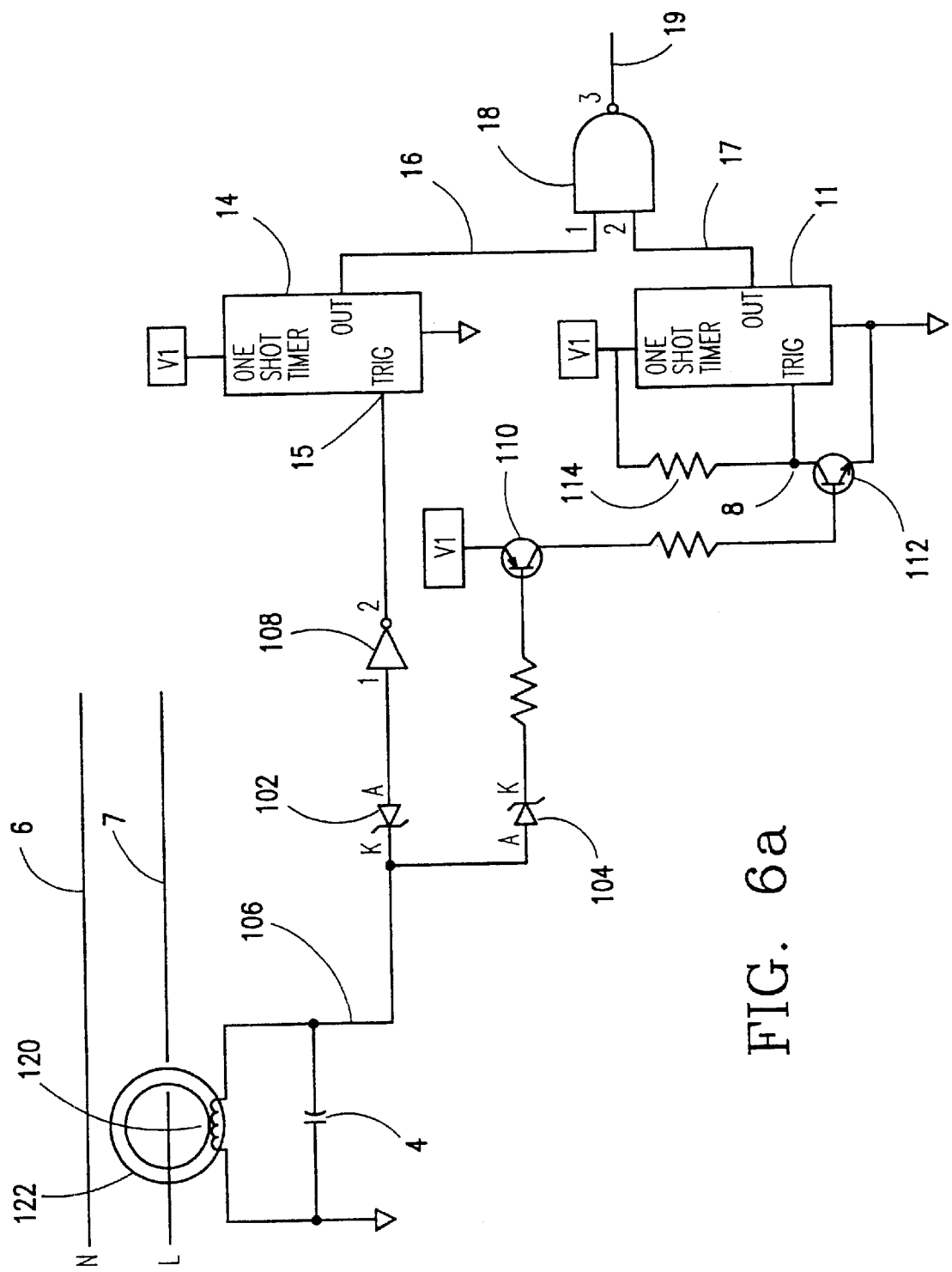
Figure 6B:
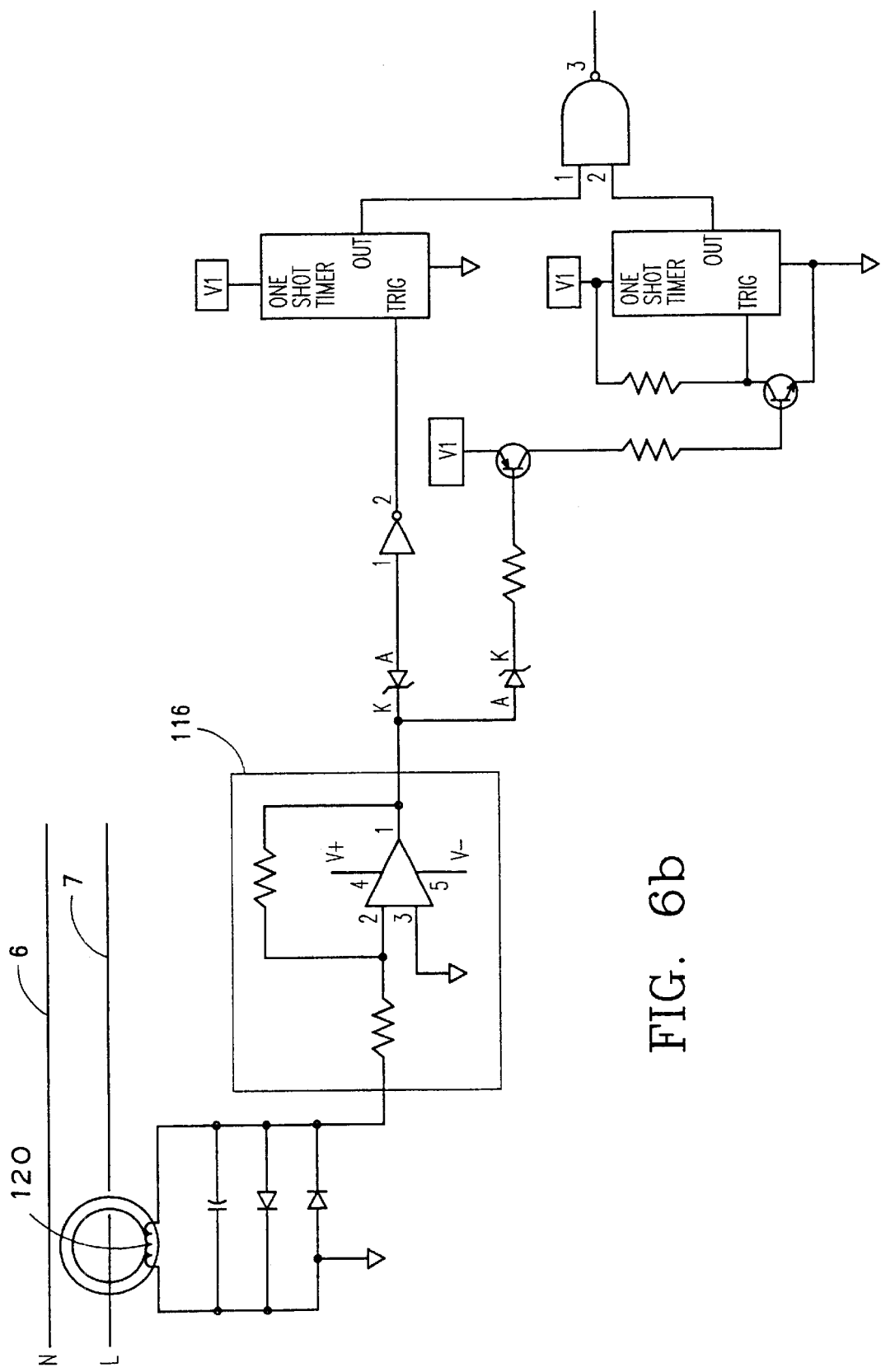
Figure 7:
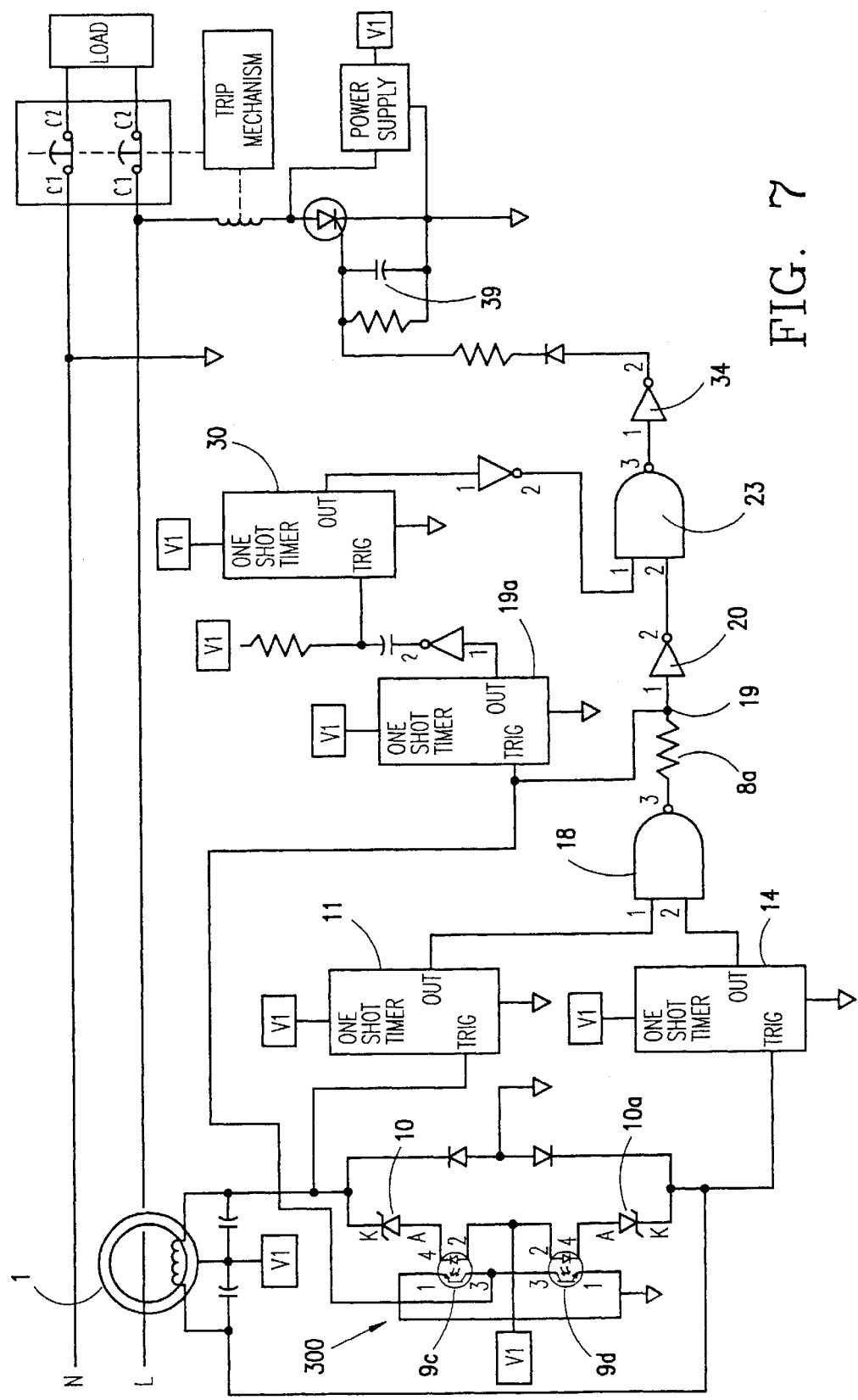

FIGS. 3 (a–j) form diagrams of signals appearing in the arc fault circuit interrupters of FIGS. 1 and 2;

FIG. 4 is a wave form diagram illustrating secondary ringing caused by high current parallel arc faults;

FIG. 5 is a schematic diagram of an arc fault circuit interrupter in accordance with an alternative embodiment of the invention, using a center tapped inductor as an arc sensor;

FIGS. 6 (a–b) is a schematic diagram showing alternate sensor circuit schematics for the circuit of FIG. 1; and FIG. 7 is a schematic diagram of an arc fault circuit interrupter similar to that shown in FIG. 1, but including a parallel fault current by-pass circuit.

DETAILED DESCRIPTION OF THE PREFERRED EMBODIMENT OF THE INVENTION

Referring now to FIG. 1, an arc fault circuit interrupter in accordance with one aspect of the present invention is illustrated in schematic form. The arc fault circuit interrupter shown in FIG. 1, as well as the arc fault circuit interrupter shown in the remaining figures are formed from small inexpensive components that can be easily integrated into an electrical receptacle, plug, or in-line device. The circuit is designed so that it can be manufactured in the same form as the ground fault circuit interrupter devices shown in U.S. Pat. Nos. 5,594,358 and 5,510,760, for example.

The arc fault circuit interrupter of FIG. 1 protects an electrical circuit including at least a neutral conductor 6 and a line conductor 7. A ground may also be present and the arc fault circuit interrupter of FIG. 1 will detect arcs occurring between the line conductor and ground, the neutral conductor and ground, or the line and neutral conductors. A circuit interrupter 45 is connected in series with the line, between the power source and the load 52. A contactor or similar device may be employed, which includes a first set of contacts connected to the neutral conductor 6 and to the load by way of conductor 50, and a second set of contacts connected to the line conductor 7, and to the load by conductor 51. Preferably, the first and second contacts are spring loaded by a mouse trap type arrangement, controlled by trip mechanism 44. When the trip mechanism is activated, the spring loaded contacts are open and latch in an open condition until they are manually reset. A device of this type is per' se well known, and is shown, for example, in Patent No. 5,510,760.

An arc fault sensor 1 includes a preferably high frequency powdered metal core having line conductor 7 or neutral conductor 6 (not shown) as its primary. Center tapped secondary winding 3 is preferably formed by a large number, for example 1000 turns of relatively small wire, such as 40 gauge wire, wound on core 2, preferably symmetrically around substantially the entire periphery of core 2. The arc fault sensor 1 may be made with two separate windings, preferably wrapped symmetrically around the core, and connected together to form two series connected windings, with the connection between the windings forming the center tap. An arc fault from the line conductor 7 to either the neutral conductor 6 or the ground or from load conductor 50 to either load conductor 51 or to ground will produce an arcing current in a line conductor 7, that will be sensed by sensor 1. The center tapped secondary winding 3 is connected to capacitors 4 and 5 that form an EFT suppression filter. The center tap winding is connected to a clamping network 54 in the form of a bridge rectifier, including clamping diodes 9, 9a, 9b, and 9c, arranged in a bridge configuration, and zener diodes 10 and 10a connected in series with clamping diodes 9 and 9a respectively.

Each winding of the center tapped secondary 3 is connected to the high impedance load consisting of the EFT suppression filters 4 and 5, the clamping network 54, and the inputs 8 and 15 of timers 11 and 14 respectively. The high impedance load on current transformer 1 causes current transformer 1 to produce an output voltage that is proportional to the derivative of the current signal in line conductor 7. This produces a large output voltage for fast rise time step changes in the current signal.

The current transformer output signals appearing at 8a and 15a are substantially equal but opposite in polarity. Clamping diodes 9b and 9c of clamping network 54 clamp negative going voltages to ground plus one diode drop, while the series combination of clamping diodes 9 and 9a with Zener diodes 10 and 10a clamp positive going voltages to the threshold voltage of the Zener diodes, plus one diode drop, above V1 the positive supply rail.

Timers 11 and 14 include trigger inputs 8 and 15 that are responsive to minus going transitions to start the timers. Timers 11 and 14 are preferably integrated circuit timers of the 555 type that can be obtained from a large number of sources.

A power supply 130 produces essentially a DC voltage V1 with respect to the neutral conductor 6. The positive voltage V1 is connected to third input terminal 54b of clamping network 54 and is also connected to the center tap 53a of secondary 3 of transformer 1. V1 also acts as the DC power supply for the rest of the circuit. Voltage V1 is connected to the trigger inputs 8 and 15 by way of coils 3a and 3b to timers 11 and 14, and acts to hold the timers off. When a minus going transition appears on either conductor 8a or 15a, the respective timer 11 or 14 is triggered.

When a first step of current in line conductor 7 occurs that is of sufficient amplitude and rise time, one of the timers 11 and 14 will be triggered, depending on the polarity of the current step. When a second step of current in the opposite direction of sufficient amplitude and rise time occurs, the other timer will be triggered. One of timers 11 or 14 is triggered by positive current steps in line conductor 7, while the other is triggered by negative current steps. Diodes 9b and 9c of clamping network 54 limit the magnitude of the negative voltage that can appear across timer inputs 8 and 15. During a fault signal, coils 3a and 3b produce substantially equal signals of opposite polarity. Zener diodes 10 and 10a provide a high clamping level across the coil which is producing positive voltage so as not to load core 2 and adversely affect the negative signal from the opposing coil. This can be readily appreciated in connection with the wave form diagrams shown in FIG. 2, which will be explained later.

The secondary winding on the sensor transformer may be wound without a center tap. Without the center tap a high speed op-amp, configured as an inverter, would be required to create the second timer trigger signal. High speed op-amps are typically expensive and require extra circuit board space. The center tap secondary design eliminates this need.

Figure 1B:
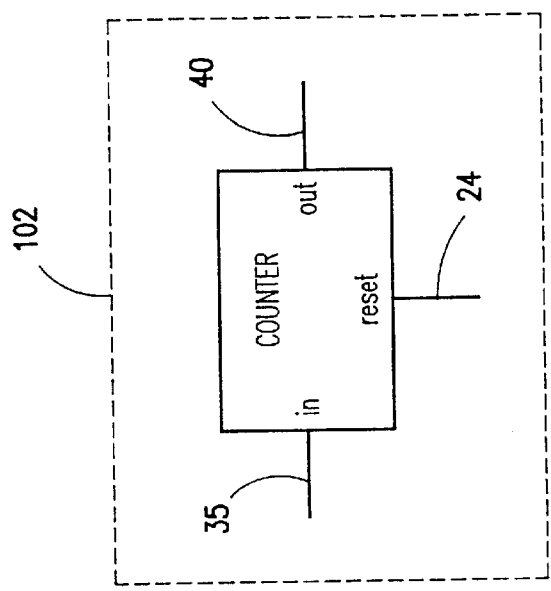
Figure 1A:
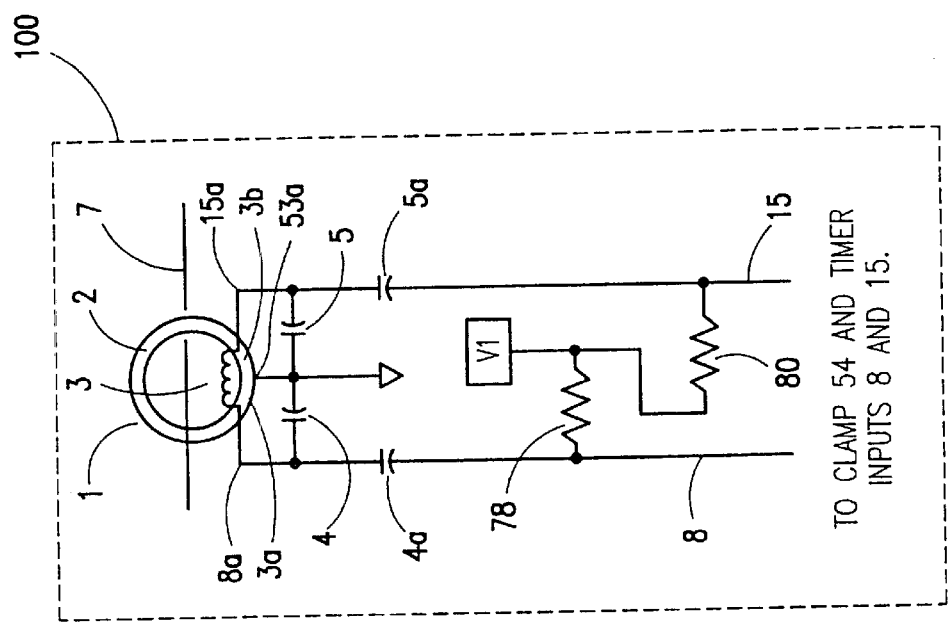

An alternate sensor 100 is shown in FIG. 1a. This sensor has a high pass filter which is used to block 50 or 60 Hz sinusoidal currents from effecting the sensor. Although sensor 1 can be designed as described above to operate without the need for a high pass filter, in some sensor designs, which may be more responsive to sinusoidal line frequency currents, the high pass filter may be required. Signals generated in sensor 1 by arc faults are coupled by DC blocking capacitors 4a and 5a to clamping network 54. Output signals 8 and 15 are connected to the trigger inputs of timers 11 and 14. Resistors 78 and 80 are connected between the inputs to the timers and a positive supply voltage V1 to hold the timer inputs high until pulses are generated. Resistors 78 and 80 in conjunction with capacitors 4a and 5a also form a high pass filter for blocking 50 or 60 Hz sinusoidal power signals. Voltages generated at inputs 8a and 15a are equal in magnitude and opposite in polarity with respect to grounded center tap 53a of the inductor. A positive step in current in conductor 7 for example, will produce a positive voltage across winding 3a and a positive spike at 8a, with a corresponding negative spike across winding 3b appearing at 15a. The positive voltage spike at 8a causes the voltage at input terminal 8 of timer 11 to rise above the supply voltage V1, by action of capacitor 4a charging, causing diodes 10a and 9a to conduct and clamp the voltage rise at the level of power supply V1, plus the voltage drop across the diodes. The negative voltage spike at 15a causes the voltage at line 15 to drop from the value V1 towards zero, as capacitor 5a charges. This triggers timer 14.

Times 11 and 14 are preferably configured as monostable timers. The outputs of the two timers are connected by leads 16 and 17, to first and second inputs of Nand Gate 18. If a step of current in one direction occurs in conductor 7, causing one of the timers to be triggered, and a second step of current in the opposite direction occurs before the first timer times out, both timers will be in the triggered state and the output 19 of Nand gate 18 will go low. In practice, an arc initiating pulse will start one of timers 11 and 14. The step of current in the other direction may be the arc extinguishing pulse at the end or close to the end of the first half cycle of arcing, or the start of the next arc in the next opposite polarity half cycle. In many cases, the arc may not extinguish until the current is close to zero, and therefore the arc extinguishing pulse may be difficult or impossible to sense. Accordingly, the periods of timers 11 and 14 must be long enough so that the arc initiating pulse of the next half cycle will occur within the period of the timers, so that Nand gate 18 will be triggered, and the signal at output 19 will go low, indicating an arc sequence.

In an embodiment of the invention for detecting series and parallel arcs, the timing interval for timers 11 and 14 is preferably set to slightly less than one half the period of the AC power line, 8.33 milliseconds for 60 hertz, or 10 milliseconds for 50 hertz. This arrangement rejects synchronous arc mimicking signals, such as those caused by switch on currents of phase control devices such as lamp dimmers.

In an embodiment of the invention adapted solely for detecting parallel arcs, the timing interval for each timer are preferably set for a predetermined time less than one complete cycle, that is less than 16.66 milli seconds for a 60 hertz circuit, and less than 20 milli seconds for a 50 hertz circuit. This arrangement is susceptible to the noise produced by phase control devices, and therefore is suitable only for parallel arc fault detection.

Before discussing the remainder of the circuits shown in FIG. 1, refer now to FIG. 2, in which another embodiment of the invention is shown that includes an RF detector 56, which is connected across the center tapped secondary of transformer 1. The RF detector preferably includes a band pass filter having a center frequency approximately equal to the characteristic frequency of the RF signals produced by the arc sensed, or by multiple bandpass filters encompassing the broadband frequency RF noise of the arc, which are ANDed together to indicate a signal, and a rectifier for producing a logic high signal when an RF signal indicating the occurrence of an arc is present. Preferably, a slight time delay is included in detector 56, so that the RF signal must be present for a predetermined time before an output signal is generated. This discriminates against some types of impulse noise that don't reliably indicate the presence of an arc.

The output of RF detector 56 is connected to a three input Nand gate 18b along with the outputs of timers 11 and 14. Nand gate 18b produces an output signal only when all three inputs are high, that is when two steps of current in opposite direction have occurred within one line cycle, 16.66 milli seconds for a 50 hertz line and 20 milli seconds for a 50 hertz line, and arc noise is also present.

The remainder of the arc fault circuit interrupter circuitry in FIGS. 1 and 2 is the same, and will now be described in connection with FIG. 1.

Enable timer 19a and blocking timer 30, together with Nand gate 23, inhibit the generation of an arc fault signal for between I and several cycles of the power line to avoid false triggering on signals resembling arc signals that are generated by lamp burnouts, normal switching arcs and the like. The output of Nand gate 18 is connected to the trigger input of enable timer 19a. When output 19 of Nand gate 18 goes low, possibly indicating an arc fault, enable timer 19a is triggered. Preferably, enable timer 19a has a period of approximately one second. Output 24 of enable timer 19a therefore goes high for approximately one second. Inverter 25 inverts this signal and triggers blocking timer 30, which has a period of from 1 to several, preferably less than 7 cycles of the power line frequency. Differentiating capacitor 26 causes blocking timer 30 to trigger only on the negative going transition of the output of inverter 25, and therefore only on the positive going transition of the output of enable timer 19a. The output 31 of blocking timer 30 is connected through inverter 32 to one input of Nand gate 23. Therefore, the first time an arc fault signal is generated by Nand gate 18, input 22 of disabling Nand gate 23 is held low. The output of Nand gate 18 is also connected through inverter 20 to the other input of Nand gate 23 and subsequent signals from Nand gate 18 that would indicate the presence of an arc are inhibited from triggering an arc fault until the passage of between 1 and 7 cycles, at which time input 22 goes high and an output from Nand gate 18 produces an output at output 33 of Nand gate 23. An arc fault can be generated at any time until enable timer 19a times out, at which time both timers 19a and 30 are reset, and the sequence is repeated.

When the output of Nand gate 23 goes low, the output 35 of inverter 34 goes high, charging capacitor 39 through diode 36 and resistor 37. When the voltage across capacitor 39, which is connected to the gate 40 of thyristor 41, reaches the trigger voltage, thyristor 41 conducts and activates solenoid 43 of trip mechanism 44, which opens contacts 45 and disconnects load 52 from the power source. The integrator formed from resistor 37 connected in series with capacitor 39 acts to store a predetermined number of arc sequence current pulses from inverter 34 before latching thyristor 41 and opening the contactor 45. Resistor 38 discharges and resets the integrator capacitor 39.

In another embodiment of the invention, illustrated in FIG. 1b, the integrator is replaced by a ripple counter 102. After a predetermined number of arc fault transistions has occurred at inverter 34, output line 35, which line is connected to the input of counter 102, the counter output connected to line 40 goes high triggering thyristor 41. Counter 102 is enabled and reset by having enabler timer 19a, output 24, connected to the counter reset terminal. In this way, a time delay occurs as the counter increments on the arc fault indicating signal.

FIGS. 3 (a–j) are wave form diagrams that are useful in understanding the operation of the embodiments of the arc fault circuit interrupter described herein. For reference, the sinusoidal line voltage is shown at FIG. 3j. All of the figures have the same time scale.

FIG. 3i shows the current wave form on the power line with an arc present. A sharp rise in current occurring at 202 in FIG. 3i indicates the initiation of an arc. Arcing waveform 200, in FIG. 3i, shows the RF noise produced by the arc. Arcing waveform 213 in FIG. 3h, and 221 in FIG. 3g, show the same RF noise. The signals produced at current transformer outputs 8a and 15a are shown in FIGS. 3g and 3h respectively. These signals are inverses of one another about a positive voltage equal to the DC supply V1. As can be seen, the rapidly rising initiation of the arc 202 generates a positive going pulse 218, on line 15a, and a negative going pulse 210 on line 8a. Although these pulses are referred to as positive and negative going, this refers only to the direction of the voltage change, not to its magnitude. The voltages are positive except for a small negative voltage due to the threshold voltage of clamping diodes 9b and 9c.

Negative going transition 201 and subsequent positive going transition 204 are produced when the arc sputters and temporarily extinguishes at 201 and is reinstated at 204. This produces pulses 212 and 220 when the arc extinguishes and pulses 214 and 222 when the arc is re-established. As shown in FIG. 3i, when the wave form approaches the zero crossing at 206, the arc is extinguished, but no pulse is generated, as shown in FIGS. 3g and 3h, because the transition is of too low a magnitude and not sharp enough to create a pulse.

As shown in FIG. 3i, the arc is then reestablished at 208 and thereafter consecutively extinguishes and re-establishes over the next four half cycles, producing consecutive positive going and negative going pulses 216 and 224, as shown in FIGS. 3g and 3h.

FIGS. 3e and 3f shown the outputs of timers 11 and 14 respectively. FIG. 3d shows the output of Nand gate 18, which is low only when both timers 11 and 14 outputs are high.

FIG. 3c shows the output 31 of blocking timer 30, and FIG. 3a shows the output 24 of enable timer 19a. FIG. 3b shows the output 35 of inverter 34. It can be seen that although Nand gate 18 produces a signal 234 as shown in FIG. 3d indicating the presence of an arc fault during the first two cycles of the wave form shown in FIG. 3j, no output is produced by inverter 34 as shown in FIG. 3b, because of the first cycle's inhibiting function.

Subsequent arc fault signals are shown in FIG. 3d after the blocking timer 30 has timed out. After a predetermined number, for example 3, of these signals have occurred, thyristor 41 is triggered and trip mechanism 44 triggers contacts 45 and the load is disconnected from the line.

FIG. 4 illustrates the waveforms of a further embodiment to the circuit illustrated in FIG. 1. Current transformer 1 may be wound and loaded to produce a ring oscillation voltage, as shown at 255 in FIG. 4e and 254 in FIG. 4f. When a parallel arc fault occurs as shown at 250, with a large step of arc current 252, a greater than typical voltage pulse occurs causing a large clamping current. This acts to trigger timers 11 and 14 nearly simultaneously as shown in FIG. 4b and 4c which produces arc detection pulses of much wider duration at the output of NAND gate 18 shown at FIG. 4a. The ring peak is a function of the resonant circuit Q of the secondary inductor with the winding capacitance, or with any capacitance placed across the secondary, and the amount of pulse current through the secondary. Winding the transformer for low capacitance and either using a low Q core material or placing a damping resistor across the secondary will reduce the ring amplitude. When a large step in line current causes the voltage across one of the secondary windings to activate one of the voltage clamps, a pulse of current passes through one half of the secondary storing enough energy to start the ring. Using the Q adjusting methods above, the peak of the ring can be set to activate one of the timers at a predetermined step level of arc current. The wide duration pulses at the output of Nand gate 18 act to charge integrator 46 at a much faster rate for quicker interrupts on high fault currents.

FIG. 5 is a schematic diagram of another embodiment of the invention, quite similar to FIG. 1, but in which the sensor is different. Referring to FIG. 5, sensor 71 is a center tapped inductor preferably in series with line conductor 7 but which could also be in series with neutral conductor 6 (not shown). Preferably, the inductor has either an air core, or a high frequency core such as a powdered iron core. EFT suppression filters 4 and 5 are connected in parallel with the two portions of the center tapped conductor and are substantially similar to the like numbered components of FIGS. 1 and 2. Signals generated in the inductors by arc faults are coupled by DC blocking capacitors 74 and 76 to clamping network 82, which again is in the form of a bridge rectifier. Output signals 8 and 15 are connected to the trigger inputs of timers 11 and 14, and the remainder of the circuit is identical to that of FIG. 1. Resistors 78 and 80 are connected between the inputs to the timers and a positive supply voltage V1 which acts to hold the timer inputs high until pulses are generated. Resistors 78 and 80 in conjunction with capacitors 74 and 76 also form a high pass filter for blocking 50 or 60 hz sinusoidal power signals. Voltages generated at timer input lines 8 and 15 are equal in magnitude and opposite in polarity with respect to grounded center tap 53 of the inductor. A positive step in current in conductor 7 for example, will produce a positive voltage across inductor 70 and a positive spike at 8a, with a corresponding negative spike across inductor 72 appearing at 1 Sa. The positive voltage spike at 8a causes capacitor 74 to charge and raise the voltage at input terminal 8 of timer 11 above the supply voltage connected to 53a. The voltage rise causes diode 82a to conduct and clamp the voltage at the level of the power supply, plus the voltage drop across the diode. The negative voltage spike at 15a causes the voltage at line 15 to drop from the value at 53a towards zero, as capacitor 76 charges, and triggers timer 14.

This series sensor circuit produces the same pulse sequences as produced by the transformer described in connection with FIG. 1. If the inductors are low enough in inductance, they do not produce enough voltage from the slow rise times created by light dimmers to trigger the timers 11 and 14, but will respond to arc faults which typically have faster rise times.

FIG. 6a shows another embodiment of the sensor circuitry used in the circuit of FIG. 1. Secondary 120 of sensor 122 is wound as a single untapped winding. Sensor 122 responds to the derivative of line current in the same way as in FIG. 1. When a step of arc current in one direction causes line 106 to produce a positive pulse of voltage, zener diode 102 conducts activating inverter 108 and triggering timer 14. When a step of arc current in the other direction causes line 106 to produce a minus pulse of voltage, zener 104 conducts causing transistor 110 and 112 to conduct activating timer 11. The circuit in FIG. 6b operates the same as the circuit of FIG. 6a except for amplifier 116. Amplifier 116 allows fewer winding turns on secondary 120. Both of these circuits demonstrate a method for creating timer trigger signals from a secondary winding without a center tap.

FIG. 7 is a schematic diagram of another embodiment of the invention, quite similar to FIG. 1, but with a high level fault current bypass circuit. In this embodiment the voltage clamp 300 incorporates opto-isolators which act to bypass timers 11 and 14. In this embodiment the transformer parameters are varied, along with the break over voltage of zener diodes 10 and 10a, to produce enough current flow through either opto-isolators 9c and 9d during large arc events to activate either of the associated opto-transistors. The collectors of the opto-isolators are connected to resistor 8a at junction 19. Resistor 8a has one end connected to junction 19 and the other end connected to the output of Nand gate 18. When a large arc fault current step causes a pulse of voltage across the secondary of sensor 1, the pulse causes a clamping action by the zener and one of the opto-diodes. Conduction of the opto diodes causes conduction of the opto transistor, which pulls line 19 low, regardless of the voltage at the output of Nand gate 18, which is isolated by resistor 8a. This action bypasses the timing window and directly causes the integrator capacitor 39 to charge via inverter 20, NAND gate 23 and inverter 34, once the holdoff time set by blocking timer 30 expires as explained for the circuit of FIG. 1.

While the embodiments described so far have all used a symmetrical current transformer with one of the hot and neutral lines extending therethrough as a primary winding, it is possible to use an asymmetrical transformer having both the hot and neutral lines extending therethrough as differential primary windings. An asymmetrical secondary winding, such as a winding formed over only a portion of the circumference of the core, can be used to provide a differential signal at the output thereof that has low common mode rejection, that is a signal which is more responsive to the current flowing in one of the conductors than the other. Alternatively, the toroidal core may be rendered unsymmetrical for example, by filing a notch or otherwise removing a portion of the core at one or more discrete locations thereon, for reducing the common mode rejection of the transformer.

Many of the logic and timing features described above may be incorporated into a microprocessor.

While the invention has been described in connection with a number of presently preferred embodiments thereof, those skilled in the art will recognize that many modifications and changes may be made therein without departing from the true spirit and scope of the invention, which accordingly is accordingly is intended to be defined solely by the appended claims.

What is claimed is:

1. An arc fault detecting device for protecting electric power lines, comprising:

a sensor for sensing the first derivative of the electric power line current;

circuit means for converting the first derivative of the line current into first and second signals, the first signal in response to step transitions of arc current of a first polarity, the second signal in response to step transitions in arc current of a second polarity, and generating a fault signal when one of the first and second signals follows the other within a first time, and a repetition of one of the first and second signals following the other of the first and second signals occurs within a second time.

2. The device of claim 1, in which the sensor comprises a current transformer with a primary and a center tapped secondary winding in which the secondary winding produces first and second signal voltages of opposite polarities with respect to the center tap; in which the voltages are proportional to the rate of change of power line current through the primary winding; and in which arc detection is determined by a step of current through the primary winding of one direction producing a pulse of voltage of one polarity at one end of the secondary, with respect to the center tap, followed by a step of current in the other direction producing a second pulse of voltage of the same polarity, with respect to the center tap, at the other end of the secondary.

3. The device of claim 2 in which the current transformer comprises a core constructed of powdered metal.

4. The device of claim 1, in which the sensor comprises a current transformer wound with a primary and secondary winding; in which the primary winding carries the power line current; and in which the secondary produces a signal proportional to the derivative of the primary current in which the circuit means for producing the second signal is an inverter circuit.

5. The device of claim 1 in which the first predetermined time is less than the time for one half cycle of power line AC current.

6. The device of claim 1 where the sensor comprises center tapped inductor in series with the power line current in which the inductor produces first and second signal voltages of opposite polarities with respect to the center tap; in which the voltages are proportional to the rate of change of power line current through the primary winding; and in which arc detect ion is determined by a step of current through the inductor in one direction producing a pulse of voltage of one polarity at one end of the inductor, with respect to the center tap, followed by a step of current in the other direction producing a second pulse of voltage of the same polarity, with respect to the center tap, at the other end of the inductor.

7. The device of claim 1 comprising an inhibiting circuit that blocks a predetermined number of signal sequences at the start of step transitions in power line current and in which the blocking causes device rejection of normal load current step events.

8. The device of claim 7 further including an enabling timer that overrides the inhibiting circuit for a predetermined interval after the predetermined inhibiting time delay has timed out.

9. The device of claim 1 comprising a detector for detecting current representing an arc event in excess of a predetermined magnitude, for generating a third signal, and generating the fault signal when a repetition of one of the third signals following another of the third signals occurs in a third time.

10. The device of claim 1 in which the detector for detecting current representing an arc event in excess of a predetermined magnitude comprises an electronic switch which operates on activation of a voltage clamp connected to the sensor.

11. The device of claim 10 in which the electronic switch for detecting current representing an arc event in excess of a predetermined magnitude comprises an optocoupler.

12. The device of claim 1 in which the detector for detecting current representing an arc event in excess of a predetermined magnitude comprises at least one optocoupler coupled to the sensor.

13. The device of claim 1 in which the detector for detecting current representing an arc event in excess of a predetermined magnitude comprises first and second optocouplers connected to the sensor in a diode bridge configuration.

14. The device of claim 1 in which the sensor comprises a high Q sensor for producing a ringing voltage in response to an arc fault in excess of a predetermined magnitude, for producing the positive and negative signals substantially simultaneously, on the first and second half cycles of the ringing voltage.

15. The device of claim 1 in which the duration of the fault signal is approximately inversely proportional to the time interval between the first signal in response to a positive step transition of arc current and second signal in response to a negative step transition of arc current.

16. The device of claim 15 where the coil produces ringing in response to arc fault signals, producing an approximate coincidence in the first and second signals and maximum duration of arc fault indicating signal thereby.

17. The device of claim 1 and further including a radio frequency detection means for detecting radio frequency signals from said current transformer and preventing generation of the fault signal if a predetermined threshold of radio frequency has not been detected.

18. The device of claim 17 where the radio frequency detection means contains a band pass filter.

19. The device of claim 17 where the radio frequency detection means comprises a plurality of non-overlapping band pass filters and a detector that is actuated only if sufficient signal is produced from each of the band pass filters.

20. The device of claim 1 and further including a high pass filter connected to the sensor to reject 60 Hz frequency components.

21. The device of claim 1 and further including a high level arc fault signal detector connected to the secondary winding of the current transformer for bypassing first timer means.

22. The device of claim 1 in which the sensor comprises an asymmetrical current transformer in which the line and neutral conductors form two equal primary windings, and in which an output signal is more responsive to signals on a selected one of the line and neutral conductor than to signals on the other conductor.

23. The device of claim 22 in which the asymmetrical current transformer comprises a core having a non uniform magnetic characteristics.

24. The device of claim 22 comprises a core having a notch formed therein.

25. The device of claim 22 in which the asymmetrical current transformer comprises a non symmetrical winding.

26. The device of claim 1, wherein the second time is determined by a counter which counts the occurrence of one of the signals following the other of the signals within the first time.

27. The device of claim 26, further comprising a timer for resetting the counter after a third time.

28. The device of claim 1, wherein the fault signal activates a circuit interrupter.

* * * * *